(12) United States Patent
Li et al.

(10) Patent No.: US 10,739,490 B2
(45) Date of Patent: Aug. 11, 2020

(54) DUAL ZONE NUCLEAR MAGNETIC RESONANCE SENSING DEVICE FOR SUBTERRANEAN CHARACTERIZATION

(71) Applicant: Halliburton Energy Services, Inc., Houston, TX (US)

(72) Inventors: Lilong Li, Humble, TX (US); Songhua Chen, Katy, TX (US); Arcady Reiderman, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 138 days.

(21) Appl. No.: 15/745,686

(22) PCT Filed: Aug. 8, 2016

(86) PCT No.: PCT/US2016/046077
§ 371 (c)(1),
(2) Date: Jan. 17, 2018

(87) PCT Pub. No.: WO2018/030994
PCT Pub. Date: Feb. 15, 2018

(65) Prior Publication Data
US 2019/0285767 A1    Sep. 19, 2019

(51) Int. Cl.
*G01V 3/32* (2006.01)
*G01N 24/08* (2006.01)
(Continued)

(52) U.S. Cl.
CPC .............. *G01V 3/32* (2013.01); *G01N 24/081* (2013.01); *G01R 33/307* (2013.01);
(Continued)

(58) Field of Classification Search
CPC .......... G01V 3/32; G01V 3/12; G01R 33/307; G01R 33/383; G01N 24/081
(Continued)

(56) References Cited

U.S. PATENT DOCUMENTS 6,111,408 A    8/2000  Blades
6,720,765 B2   4/2004  Edwards et al.
(Continued)

FOREIGN PATENT DOCUMENTS

WO    03040743 A1    5/2003
WO    2004099817 A2  11/2004
(Continued)

OTHER PUBLICATIONS

International Search Report and Written Opinion dated Apr. 26, 2017, for PCT Application No. PCT/US2016/046077 filed on Aug. 8, 2016.
(Continued)

*Primary Examiner* — Melissa J Koval
*Assistant Examiner* — Trung Nguyen
(74) *Attorney, Agent, or Firm* — Chamberlain Hrdlicka (57) ABSTRACT

A subterranean characterization and fluid sampling device includes a tool body, a probing module, and a permanent magnet. The tool body includes a fluid testing module configured to retain a fluid sample and an internal radio frequency coil disposed within the tool body and drivable to generate RF magnetic field $B_2$. The probing module is coupled to the tool body and configured to withdraw the fluid sample from a formation and deliver the fluid sample to the fluid testing module. The probing module comprises an external antenna drivable to generate RF magnetic field $B_1$. The permanent magnet induces static magnetic field $B_0$. The permanent magnet is coupled to the tool body and external to the probing module.

18 Claims, 5 Drawing Sheets

(51) Int. Cl.
*G01R 33/30* (2006.01)
*G01R 33/383* (2006.01)
*G01V 3/12* (2006.01)
*G01V 3/14* (2006.01)
*G01R 33/38* (2006.01)

(52) U.S. Cl.
CPC ............. *G01R 33/383* (2013.01); *G01V 3/12* (2013.01); *G01V 3/14* (2013.01); *G01R 33/302* (2013.01); *G01R 33/3808* (2013.01)

(58) Field of Classification Search
USPC ....... 324/303–315, 324, 325, 353, 200, 204, 324/500, 750.08, 754.15, 92
See application file for complete search history.

(56) References Cited

U.S. PATENT DOCUMENTS

| | | | |
|---|---|---|---|
| 7,180,288 B2 | 2/2007 | Scheven | |
| 7,532,007 B2 | 5/2009 | Song | |
| 8,471,559 B2 | 6/2013 | Taherian et al. | |
| 8,471,599 B2 | 6/2013 | Lee et al. | |
| 8,720,552 B2 | 5/2014 | Ayan et al. | |
| 8,794,318 B2 * | 8/2014 | Harrigan | E21B 49/008 166/100 |
| 9,051,822 B2 | 6/2015 | Ayan | |
| 2002/0036503 A1 | 3/2002 | Toufaily et al. | |
| 2003/0020473 A1 | 1/2003 | Speier et al. | |
| 2004/0056658 A1 | 3/2004 | Masak et al. | |
| 2005/0030021 A1 | 2/2005 | Prammer | |
| 2008/0136410 A1 | 6/2008 | Song | |
| 2008/0174313 A1 | 7/2008 | Ganesan | |
| 2009/0072825 A1 | 3/2009 | Prammer et al. | |
| 2011/0198078 A1 | 8/2011 | Harrigan | |
| 2011/0227570 A1 | 9/2011 | Anand et al. | |
| 2011/0284227 A1 | 11/2011 | Ayan | |
| 2013/0073206 A1 | 3/2013 | Hou et al. | |
| 2013/0081803 A1 | 4/2013 | Tao et al. | |
| 2013/0093422 A1 | 4/2013 | Morys et al. | |
| 2014/0145716 A1 | 5/2014 | Dirksen et al. | |
| 2015/0054503 A1 | 2/2015 | Chen | |
| 2015/0061665 A1 | 3/2015 | Reiderman | |
| 2015/0192011 A1 * | 7/2015 | Mandal | E21B 49/087 324/303 |
| 2015/0212225 A1 | 7/2015 | Reiderman | |
| 2016/0033670 A1 | 2/2016 | Reiderman | |

FOREIGN PATENT DOCUMENTS

| | | |
|---|---|---|
| WO | WO2010085533 A3 | 10/2010 |
| WO | 2015072985 A1 | 5/2015 |
| WO | 2015088551 A1 | 6/2015 |
| WO | WO2015088551 A1 | 6/2015 |

OTHER PUBLICATIONS

International Search Report and Written Opinion issued in PCT/US2016/046076, International Search Report and Written Opinion issued in PCT/US2016/046076, dated May 1, 2017, 16pgs.

* cited by examiner

DUAL ZONE NUCLEAR MAGNETIC RESONANCE SENSING DEVICE FOR SUBTERRANEAN CHARACTERIZATION

BACKGROUND

Various types of formation and fluid evaluations are performed on oil and gas well before and during production operations. One type of formation evaluation is conducted with downhole nuclear magnetic resonance (NMR) logging. NMR logging, a subcategory of electromagnetic logging, measures the induced magnet moment of hydrogen nuclei (protons) contained within the fluid-filled pore space of a formation. NMR can be used to measure the volume, composition, viscosity, and distribution of these fluids, for example. NMR logging is typically performed by specialized wireline or LWD (logging-while-drilling) NMR logging tools.

NMR logging tools are typically placed close to a wellbore wall to take NMR measurements. The tool body typically includes permanent magnets that generate a static magnetic field and an antenna or radio frequency coil for generating an RF magnet field and detecting the NMR data.

BRIEF DESCRIPTION OF THE DRAWINGS

For a detailed description of the embodiments of the invention, reference will now be made to the accompanying drawings in which.

DETAILED DESCRIPTION

Figure 1A:
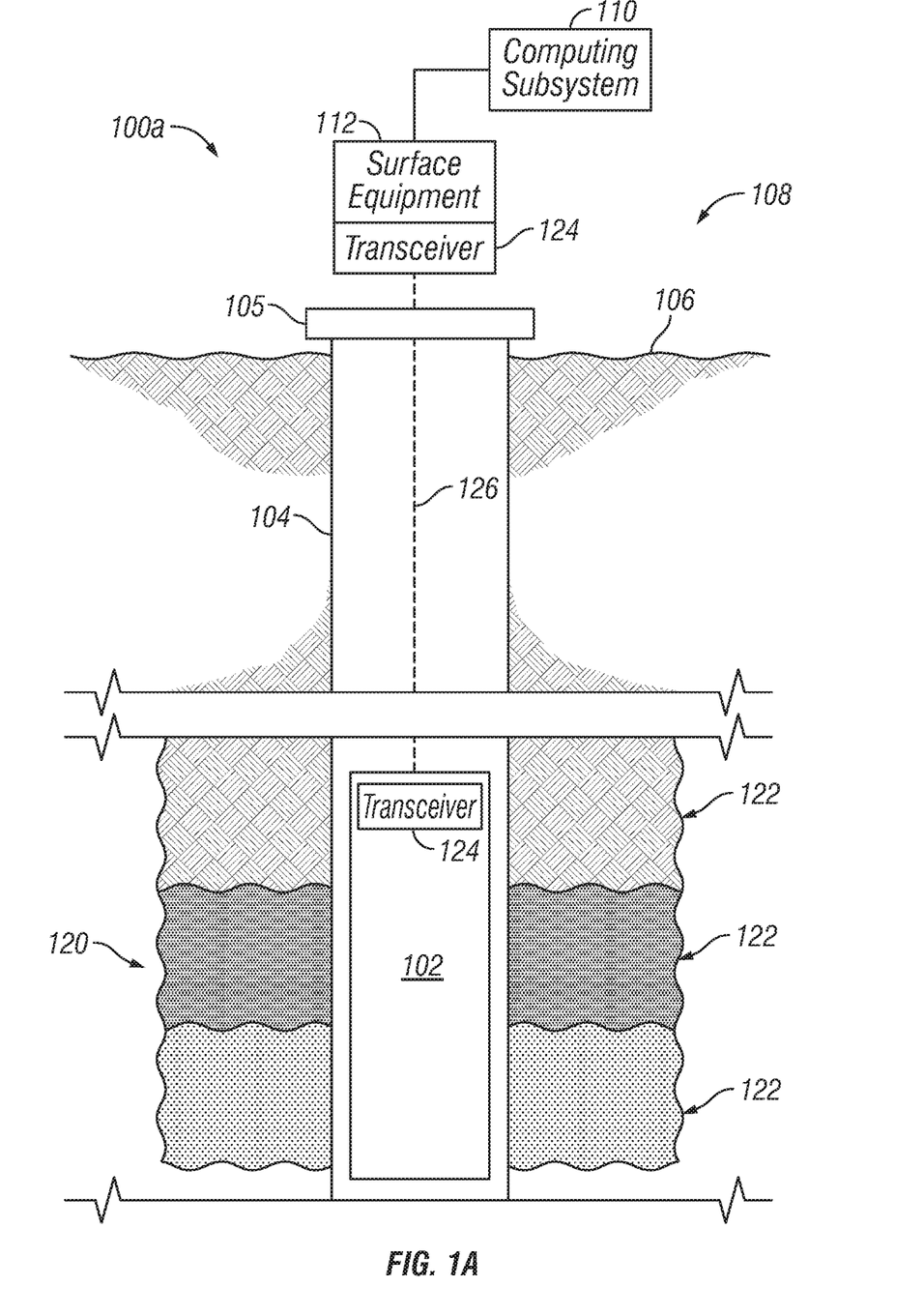
FIG. 1A is a schematic elevation view of an example dual zone nuclear magnetic resonance (NMR) logging operation in a well system, in accordance with example embodiments.

Referring to the drawings, FIG. 1A is a schematically-drawn elevation view of an example NMR logging operation 100a. The example NMR logging operation 100a utilizes a dual zone NMR logging system 108 in a subterranean region 120 beneath the ground surface 106. As NMR logging operation 100a can include additional or different features that are not shown in FIG. 1A. For example, the well system NMR logging operation 100a may also utilize additional drilling system components, wireline logging system components, etc.

The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1A is a vertical wellbore, the dual zone NMR logging system 108 can be implemented in other wellbore orientations. For example, the dual zone NMR logging system 108 may be adapted for horizontal wellbores, slant wellbores, curved wellbores, vertical wellbores, or combinations of these.

The example dual zone NMR logging system 108 includes a dual zone NMR logging tool 102, surface equipment 112, and a computing subsystem 110 configured to control various aspects of the logging tool 102 and/or receive data therefrom. In the example shown in FIG. 1A, the dual zone NMR logging tool 102 is a downhole logging tool that operates while disposed in the wellbore 104. The example surface equipment 112 shown in FIG. 1A operates at or above the surface 106, for example, near the well head 105, to control the dual zone NMR logging tool 102 and possibly other downhole equipment or other components of the well system 100. The example computing subsystem 110 can receive and analyze logging data from the dual zone NMR logging tool 102, as well as fluid sampling data. An NMR logging system can include additional or different features, and the features of an NMR logging system can be arranged and operated as represented in FIG. 1A or in another manner.

In one or more instances, all or part of the computing subsystem 110 can be implemented as a component of, or can be integrated with one or more components of, the surface equipment 112, the dual zone NMR logging tool 102 or both. In one or more cases, the computing subsystem 110 can be implemented as one or more computing structures separate from the surface equipment 112 and the dual zone NMR logging tool 102.

In one or more implementations, the computing subsystem 110 is embedded in the dual zone NMR logging tool 102, and the computing subsystem 110 and the dual zone NMR logging tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the dual zone NMR logging tool 102.

The dual zone NMR logging system 108 can include communication or telemetry equipment that allow communication among the computing subsystem 110, the dual zone NMR logging tool 102, and other components of the dual zone NMR logging and fluid sampling system 108. For example, the logging tool 102 and surface equipment 112 can each include one or more transceivers 124 or similar apparatus for wired or wireless data communication among the various components. The dual zone NMR logging and fluid sampling system 108 can include a communication channel 126 such as systems and apparatus for wireline telemetry, wired pipe telemetry, mud pulse telemetry, acoustic telemetry, electromagnetic telemetry, or a combination of these and other types of telemetry. In one or more cases, the dual zone NMR logging tool 102 receives commands, status signals, or other types of information from the computing subsystem 110 or another source via the transceivers 124 and communication channel 126. In one or more cases, the computing subsystem 110 receives logging data, status signals, or other types of information from the dual zone NMR logging tool 102 or another source.

NMR logging and/or fluid sampling operations can be performed in connection with various types of downhole operations at various stages in the lifetime of a well system. Structural attributes and components of the surface equipment 112 and dual zone NMR logging tool 102 can be adapted for various types of NMR logging and/or fluid sampling operations. For example, NMR logging and/or fluid sampling may be performed during drilling operations, during wireline logging operations, or in other contexts. As such, the surface equipment 112 and the dual zone NMR logging tool 102 may include, or may operate in connection with drilling equipment, wireline logging equipment, or other equipment for other types of operations.

Figure 1B:
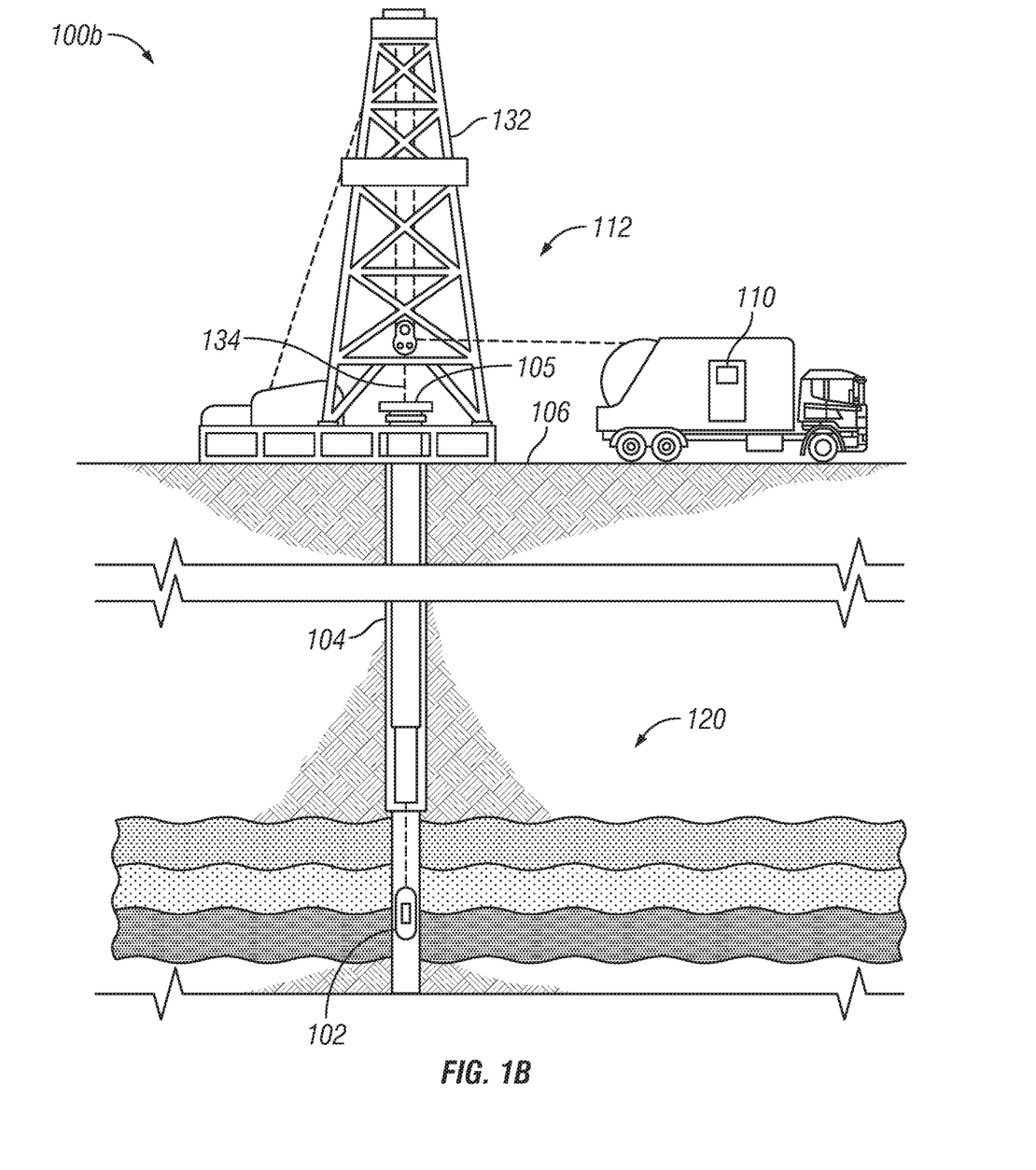
FIG. 1B is a schematic elevation view of a wireline dual zone NMR logging system deployed in a well system, in accordance with example embodiments.

In one or more examples, NMR logging and/or fluid sampling operations are performed during wireline logging operations. FIG. 1B shows an example well system 100b that includes the dual zone NMR logging tool 102 in a wireline logging environment. In one or more example wireline logging operations, the surface equipment 112 includes a platform above the surface 106 equipped with a derrick 132 that supports a wireline cable 134 that extends into the wellbore 104. Wireline logging operations can be performed, for example, after a drill string is removed from the wellbore 104, to allow the wireline dual zone NMR logging tool 102 to be lowered by wireline or logging cable into the wellbore 104. The wireline cable 134 may contain conductors for carrying power to the various components of the dual zone NMR logging tool 102 and conductors or cables, such as coaxial or fiber optic cables, for providing two-way data communication between the dual zone NMR logging tool 102 and the computing subsystem 110.

Figure 1C:
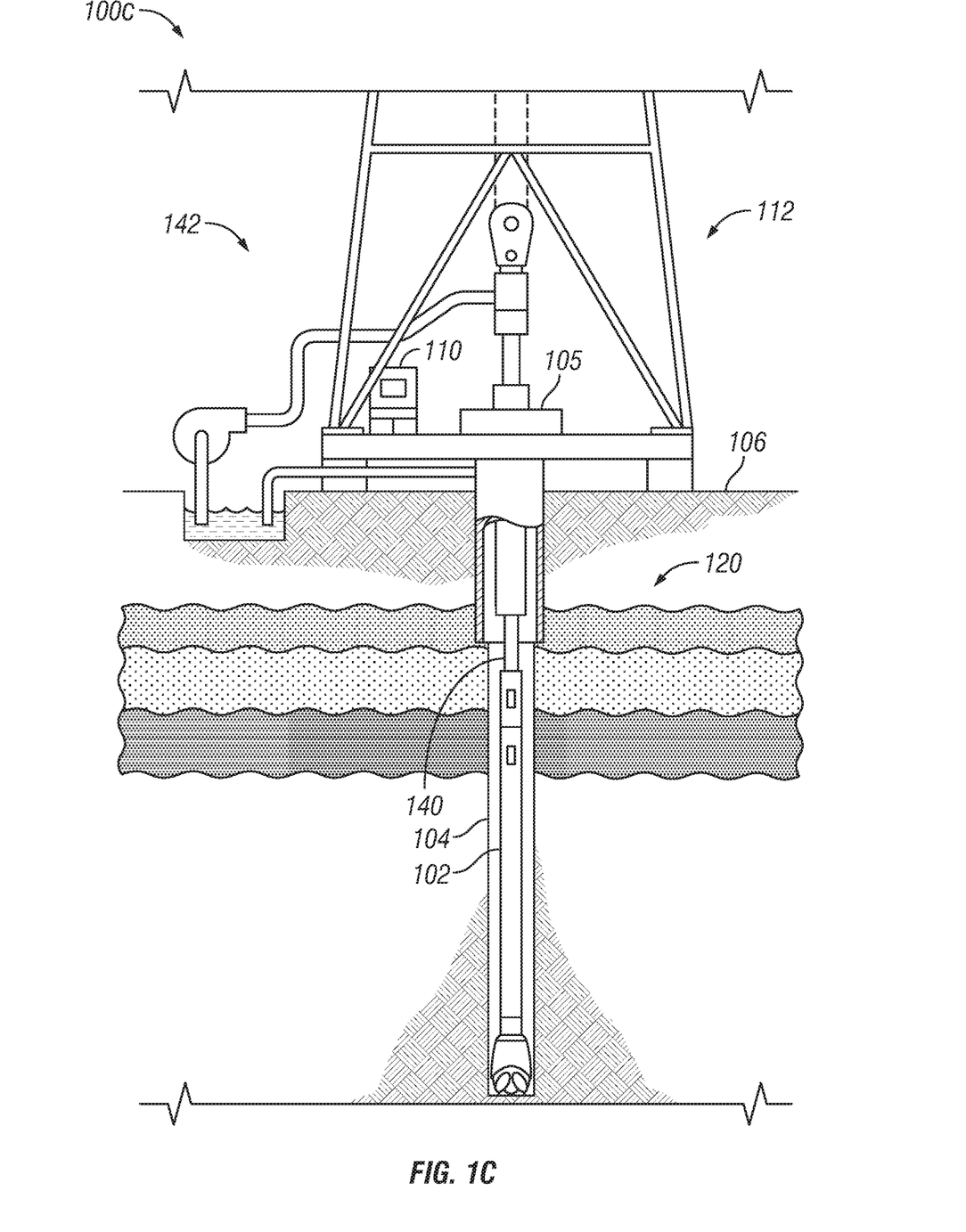
FIG. 1C is a schematic diagram of a dual zone NMR logging tool in a logging while drilling (LWD) environment, in accordance with example embodiments.

In one or more examples, NMR logging and/or sampling operations are performed during drilling operations. FIG. 1C shows an example well system 100c that includes the dual zone NMR logging tool 102 in a logging while drilling (LWD) environment. Drilling is commonly carried out using a string of drill pipes connected together to form a drill string 140 that is lowered through a rotary table into the wellbore 104. In one or more cases, a drilling rig 142 at the surface 106 supports the drill string 140, as the drill string 140 is operated to drill a wellbore penetrating the subterranean region 120. The drill string 140 may include, for example, drill pipe, a bottom hole assembly, and other components. The bottom hole assembly on the drill string may include drill collars, drill bits, the dual zone NMR logging tool 102, and other components. The logging and sampling tools may include measuring while drilling (MWD) tools, LWD tools, and the like.

As shown in FIG. 1B, the dual zone NMR logging tool 102 can be suspended in the wellbore 104 by a coiled tubing, wireline cable, or another structure that connects the tool to a surface control unit or other components of the surface equipment 112. In one or more example implementations, the dual zone NMR logging tool 102 is lowered to the bottom of a region of interest and subsequently pulled upward (e.g., at a substantially constant speed) through the region of interest. As shown, for example, in FIG. 1C, the dual zone NMR logging tool 102 can be deployed in the wellbore 104 on jointed drill pipe, hard wired drill pipe, or other deployment hardware. In one or more example implementations, the dual zone NMR logging tool 102 collects data during drilling operations as it moves downward through the region of interest. In one or more example implementations, the dual zone NMR logging tool 102 collects data while the drill string 140 is moving, for example, while it is being tripped in or tripped out of the wellbore 104.

The dual zone NMR logging tool 102 is configured to take NMR measurements of at least two zones. In one or more embodiments, the first zone is an area of interest within the formation external to the dual zone NMR logging tool 102. The second zone is internal to the dual zone NMR logging tool 102. Specifically, NMR measurements can be taken of fluid extracted from the formation and collected inside of the dual zone NMR logging tool 102. In one or more embodiments, the dual zone NMR logging tool 102 is configured to take NMR measurements of a region within the tool, external to the tool, or both.

Figure 2:
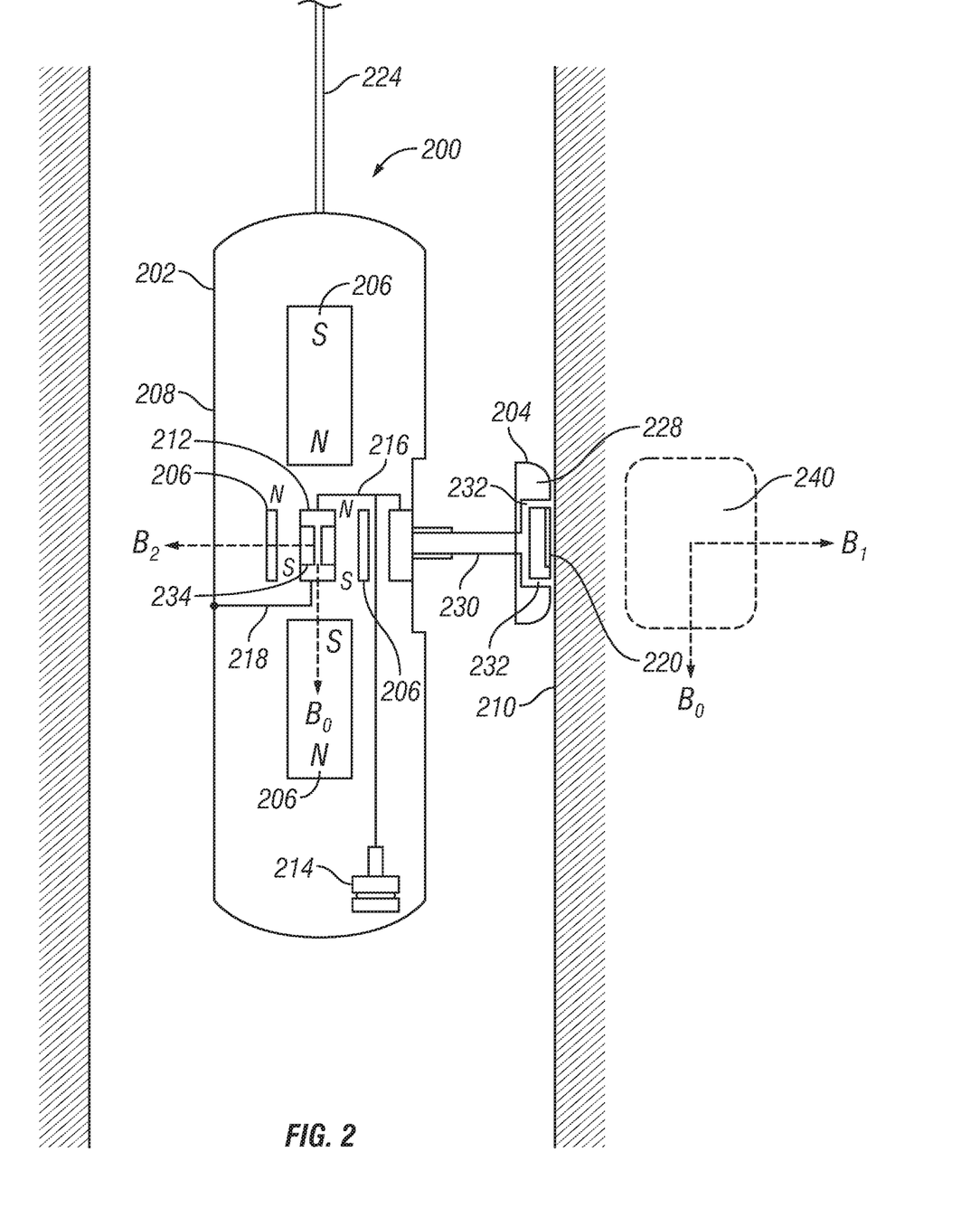
FIG. 2 is a cross-sectional diagram of a dual zone NMR logging tool, in accordance with example embodiments.

FIG. 2 depicts a cross-sectional diagram of a dual zone NMR logging tool 200 deployed downhole via a wireline 224, similar to the tool 102 of FIG. 1, in accordance with one or more embodiments. The dual zone NMR logging tool 200 includes a tool body 202 and a probe 204. The tool body 202 includes one or a plurality of magnets 206 that induce a combined static magnetic field, $B_0$. The magnets 206 are located within the tool body 202 as illustrated in FIG. 2, however, the magnets can alternatively be located on the outside of the tool body 202, such as coupled to an outer surface 208 of the tool body 202. The configuration of magnets 206 in the dual zone NMR logging tool 200 illustrated in FIG. 2 is an example configuration, designed to generate a specific magnetic field shape appropriate for a specific application. However, the magnets 206 can be configured in any other orientation, with different polarity orientations, sizes, shapes, positioning. There may also be more or fewer magnets 206 than illustrated in FIG. 2. The overall configuration of magnets 206 is selected based on the desired static magnetic field, $B_0$.

The probe module 204 is extendable from the tool 200 via an extension mechanism 230, such as telescoping arms, scissor extensions, and the like. The probe 204 can be extended outwardly from the tool 200 to contact the borehole wall 210. In one or more embodiments, the probe 204 includes a sealing pad 228 configured to provide sealing contact with a surface of the borehole at a desired location. The sealing pad 228 may include electrical and mechanical components that facilitate testing, sampling, and retrieval of fluids from the formation. The probe 204 includes one or more channels 232 through which fluids from the sealed-off part of the formation surface may be collected and brought into the tool 202. The sealing pad 228 may be made of an elastomeric material, such as rubber, compatible with the well fluids and the physical and chemical conditions expected to be encountered in an underground formation. In one or more embodiments, the probe 204 is outwardly extendable from the tool body 202.

The probe 204 includes an antenna or radio frequency (RF) coil 220 configured to emit NMR signals. The coil 220 may be located on a surface of the probe 204 or embedded within the probe 204. The coil 220 may be a radial coil, a tangential coil, or the like. In one or more embodiments, the coil 220 may include both a radial coil and a tangential coil. In one or more embodiments the probe 204 may include more than one coil 220 positioned in any position relative to each other, generating a combined RF field.

The dual zone NMR logging tool 200 is brought into a position within the wellbore 104 approximate to a region of interest 240 in the surrounding formation, and the coil 220 in the probe 204 generates an RF field During an NMR measurement of the region of interest 240 of the formation. The magnets 206 induce a static magnetic field, $B_0$, in the region of interest 240. The coil 220 in the measurement device 210 is driven to generate a radio frequency (RF) magnetic field, $B_1$, in the region of interest 240 within the formation. In one or more embodiments, $B_0$ and $B_1$ are substantially orthogonal to each other in the region of interest 240. In one or more embodiments, the measurement device 210 may also include strategically placed soft magnetic material, which is a material that is easily magnetized and demagnetized to further enhance and shape the status magnetic field, $B_0$, to the desired shape. The combined $B_0$ and $B_1$ field cause polarizing nuclear spins in the formation at the region of interest 240, which, in one or more embodiments, is sensed by the RF coil 220, constituting NMR logging data of formation. In one or more other embodiments, the nuclear spins are sensed by a separate RF coil.

The tool body 202 further includes a fluid sample container 212 configured to hold the fluid sampled collected by the probe 204. The fluid sampling container 212 is coupled to the probe 204 via a flow line 216. In one or more embodiments, a pump 214 controls the formation fluid flow from the formation into the probe 206 and to the fluid sample container 212 via the flow line 216. In one or more embodiments, a drain line 218 is coupled to the container 212 and provides a pathway to drain fluid from the container 212 and out of the dual zone NMR logging tool 200. Thus, fluid from multiple regions can be collected, tested, and drained, without needing to pull the dual zone NMR logging tool 200 out of hole.

A second antenna or RF coil 234 is located inside the tool body 202 approximate the fluid sample container 212. The second RF coil 234 is controllable to generate a second RF magnetic field, $B_2$. The static magnetic field, $B_0$, induced by the magnets 206 and the second RF magnet field, $B_2$, are substantially orthogonal to each other at the fluid sample held by the fluid sample container 212, or the second NMR zone. The combined $B_0$ field generates nuclear spin polarization in the sample fluid, and the $B_2$ field produced by RF coil 234 causes nuclear spin precession which is subsequently sensed by the second RF coil 234 or another RF coil, constituting NMR logging data of the extracted fluid sample or the second zone. In one or more embodiments, the magnetic field at the fluid sample is substantially uniform.

Figure 3:
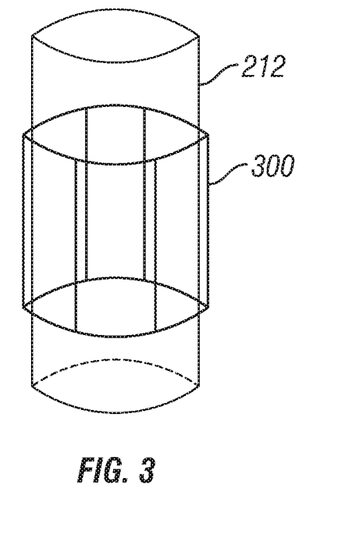
FIG. 3 is an illustration of a birdcage coil located around the fluid sample container of a dual zone NMR logging tool, in accordance with example embodiments.
Figure 4:
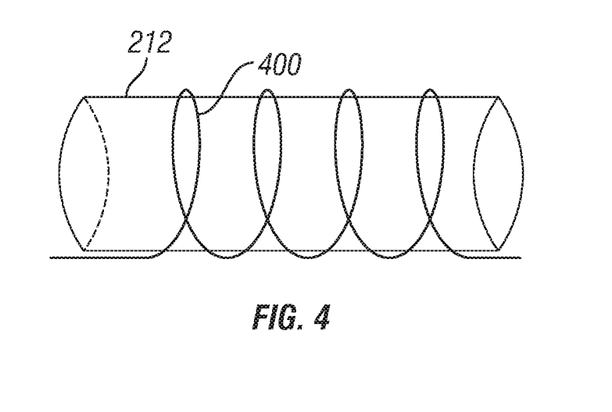
FIG. 4 is an illustration of a solenoid coil located inside the fluid sample container of a dual zone NMR logging tool, in accordance with example embodiments.
Figure 5:
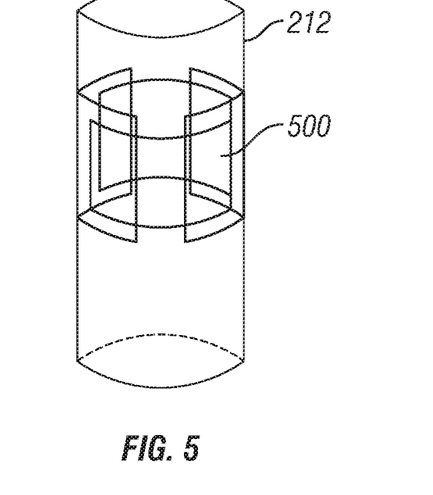
FIG. 5 is an illustration of two saddle-shape coils located around the fluid sample container of a dual zone NMR logging tool, in accordance with example embodiments.

FIGS. 3-5 depict example coil 234 configurations that can be used, among others not expressly shown for the sake of brevity. FIG. 3 illustrates a birdcage coil 300 located around the fluid sample container 212. FIG. 4 illustrates a solenoid coil 400 located inside the fluid sample container 212. FIG. 5 illustrates two saddle-shape coils 500 located around the fluid sample container 212. The configuration or shape of the second RF coil 234 is selected based on the desired second magnetic RF field, $B_2$.

In one or more embodiments, the coil 234 includes a microcoil (i.e., a coil typically smaller than 1 mm) and a set of shimming coils configured to enable NMR spectroscopy and chemical shift analysis on the fluid sample collected in the fluid sample container 212. In one or more embodiments, the tool body 202 may include multiple fluid sample containers 212 and multiple coils 234. The coils 234 may be configured differently and/or driven differently to produce different pulsed field gradients. Thus, various responses can be collected, providing varied insight into fluid properties, including but not limited to, diffusion behavior of the fluid and phase ratios.

In one or more implementations, the dual zone NMR logging tool 102 obtains NMR signals by polarizing nuclear spins in the formation 120 and pulsing the nuclei with a radio frequency (RF) magnetic field. Various pulse sequences (i.e., series of radio frequency pulses, delays, and other operations) can be used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the refocusing pulses are less than 180°, a saturation recovery pulse sequence, and other pulse sequences.

The dual zone NMR logging tool 102 may collect data at discrete logging points in the wellbore 104. For example, the dual zone NMR logging tool 102 can move upward or downward incrementally to each logging point at a series of depths in the wellbore 104. At each logging point, instruments in the dual zone NMR logging tool 102 perform measurements on the subterranean region 120. The measurement data can be communicated to the computing subsystem 110 for storage, processing, and analysis. Such data may be gathered and analyzed during drilling operations (e.g., during logging while drilling (LWD) operations), during wireline logging operations, or during other types of activities.

The computing subsystem 110 can receive and analyze the measurement data from the dual zone NMR logging tool 102 to detect properties of various subsurface layers 122. For example, the computing subsystem 110 can identify the density, material content, or other properties of the subsurface layers 122 based on the NMR measurements acquired by the dual zone NMR logging tool 102 in the wellbore 104.

The dual zone NMR logging tool 200 may operate while stationary for taking dual zone NMR measurements for formation and fluid characterization, as described above. In one or more embodiments, the dual zone NMR logging tool 200 may operate in a non-stationary mode in which the tool 200 collects NMR measurements for formation evaluation across a changing region of interest of the well while the tool 200 is moving. In some embodiments, the tool is configured to perform such non-stationary formation evaluation while also characterizing fluid collected from a prior stationary operation.

In addition to the embodiments described above, many examples of specific combinations are within the scope of the disclosure, some of which are detailed below:

Example 1

A subterranean characterization and fluid sampling device for testing a fluid sample from a subterranean formation, comprising:
  a tool body including a fluid testing module configured to retain the fluid sample, a permanent magnet configured generating a static magnetic field $B_0$, and a radio frequency coil located within the tool body, wherein the radio frequency coil generates a radio frequency magnetic field $B_2$ in response to a first control signal; and
  a probing module coupled to the tool body and configured to withdraw the fluid sample from the formation and deliver the fluid sample to the fluid testing module, wherein the probing module includes a probe radio frequency coil that generates a radio frequency magnetic field $B_1$ in response to a second control signal.

Example 2

The device of claim 1, wherein the probing module comprises a sealing pad configured to seal against the formation.

Example 3

The device of claim 2, wherein the probe radio frequency coil is embedded within the sealing pad.

Example 4

The device of claim 1, wherein the probing module comprises a soft magnetic material.

Example 5

The device of claim 1, wherein $B_0$ is substantially orthogonal to $B_1$ in a region of interest external to the tool body.

Example 6

The device of claim 1, wherein $B_0$ is substantially orthogonal to $B_2$ in a region of interest within the tool body.

Example 7

The device of claim 1, wherein the probing module is outwardly extendable from the tool body.

Example 8

The device of claim 1, wherein the probing module is separate from the permanent magnet.

Example 9

A subterranean characterization and fluid sampling device for testing a fluid sample from a subterranean formation, comprising:
  a controller;
  a tool body including a fluid testing module configured to receive the fluid sample, a permanent magnet generating a static magnetic field $B_0$, the permanent magnet located within the tool body, and a radio frequency coil located within the tool body and coupled to the controller, wherein the radio frequency coil generates a radio frequency magnetic field $B_2$ in response to a first signal from the controller; and
  a probing module extendable from the tool body and configured to withdraw the fluid sample from the formation and deliver the fluid sample to the fluid testing module, wherein the probing module includes a probe radio frequency coil coupled to the controller that generates a radio frequency magnetic field $B_1$ in response to a second signal from the controller.

Example 10

The device of claim 9, wherein $B_0$ is substantially orthogonal to $B_1$ in a region of interest external to the tool body.

Example 11

The device of claim 9, wherein $B_0$ is substantially orthogonal to $B_2$ in a region of interest within the tool body.

Example 12

The device of claim 9, wherein the radio frequency coil is configured to sense an internal nuclear magnetic resonance signal.

Example 13

The device of claim 9, wherein the probe radio frequency coil is controllable to sense an external nuclear magnetic resonance signal.

Example 14

The device of claim 9, wherein the tool body comprises a microcoil, a shimming coil, or both.

Example 15

The device of claim 9, wherein the radio frequency coil surrounds the fluid testing module.

Example 16

The device of claim 9, wherein the radio frequency coil is located within the fluid testing module.

Example 17

A method of subterranean characterization, comprising:
  inducing a magnetic field $B_0$ via a permanent magnet located within a tool body of a nuclear magnetic resonance device;
  generating a radio frequency magnetic field $B_1$ at a region of interest external to the tool body via an external radio frequency coil located in a probing module of the nuclear magnetic resonance device;
  generating a radio frequency magnetic field $B_2$ at a region of interest inside the tool body via an internal radio frequency coil located in the tool body of the nuclear magnetic resonance device;
  receiving an external nuclear magnetic resonance signal from the external region of interest; and
  receiving an internal nuclear magnetic resonance signal from the internal region of interest.

Example 18

The method of claim 17, further comprising performing nuclear magnetic resonance spectroscopy.

Example 19

The method of claim 17, further comprising performing chemical shift analysis.

Example 20

The method of claim 17, further comprising withdrawing fluid from a formation via the probing module.

Example 21

The method of claim 17, further comprising generating a pulse field gradient.

Example 22

The method of claim 17, further comprising:
  moving the probing module, thereby changing the region of interest; and
  collecting the received external nuclear magnetic resonance signal over the changing region of interest.

This discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A subterranean characterization and fluid sampling device for testing a fluid sample from a subterranean formation, comprising:
    a tool body including a fluid testing module configured to retain the fluid sample, a permanent magnet configured to generate a static magnetic field $B_0$ that extends both through the tool body and into the formation, and a radio frequency coil located within the tool body, wherein the radio frequency coil generates a radio frequency magnetic field $B_2$ in response to a first control signal;
    a probing module coupled to the tool body and configured to withdraw the fluid sample from the formation and deliver the fluid sample to the fluid testing module, wherein the probing module includes a probe radio frequency coil that generates a radio frequency magnetic field $B_1$ in response to a second control signal;
    wherein $B_0$ is substantially orthogonal to $B_1$ in a region of interest external to the tool body; and
    wherein $B_0$ is substantially orthogonal to $B_2$ in a region of interest within the tool body.

2. The device of claim 1, wherein the probing module comprises a sealing pad configured to seal against the formation.

3. The device of claim 2, wherein the probe radio frequency coil is embedded within the sealing pad.

4. The device of claim 1, wherein the probing module comprises a soft magnetic material.

5. The device of claim 1, wherein the probing module is outwardly extendable from the tool body.

6. The device of claim 1, wherein the probing module is separate from the permanent magnet.

7. A subterranean characterization and fluid sampling device for testing a fluid sample from a subterranean formation, comprising:
    a controller;
    a tool body including a fluid testing module configured to receive the fluid sample, a permanent magnet configured to generate a static magnetic field $B_0$ that extends both through the tool body and into the formation, the permanent magnet located within the tool body, and a radio frequency coil located within the tool body and coupled to the controller, wherein the radio frequency coil generates a radio frequency magnetic field $B_2$ in response to a first signal from the controller;
    a probing module extendable from the tool body and configured to withdraw the fluid sample from the formation and deliver the fluid sample to the fluid testing module, wherein the probing module includes a probe radio frequency coil coupled to the controller that generates a radio frequency magnetic field $B_1$ in response to a second signal from the controller;
    wherein $B_0$ is substantially orthogonal to $B_1$ in a region of interest external to the tool body; and
    wherein $B_0$ is substantially orthogonal to $B_2$ in a region of interest within the tool body.

8. The device of claim 7, wherein the radio frequency coil is configured to sense an internal nuclear magnetic resonance signal.

9. The device of claim 7, wherein the probe radio frequency coil is controllable to sense an external nuclear magnetic resonance signal.

10. The device of claim 7, wherein the tool body comprises a microcoil, a shimming coil, or both.

11. The device of claim 7, wherein the radio frequency coil surrounds the fluid testing module.

12. The device of claim 7, wherein the radio frequency coil is located within the fluid testing module.

13. A method of subterranean characterization, comprising:
    inducing a magnetic field $B_0$ both in the tool body and in the formation via a permanent magnet located within a tool body of a nuclear magnetic resonance device;
    generating a radio frequency magnetic field $B_1$ at a region of interest external to the tool body via an external radio frequency coil located in a probing module of the nuclear magnetic resonance device, wherein $B_0$ is substantially orthogonal to $B_1$ in a region of interest external to the tool body;
    generating a radio frequency magnetic field $B_2$ at a region of interest inside the tool body via an internal radio frequency coil located in the tool body of the nuclear magnetic resonance device, wherein $B_0$ is substantially orthogonal to $B_2$ in a region of interest within the tool body;

receiving an external nuclear magnetic resonance signal from the external region of interest; and receiving an internal nuclear magnetic resonance signal from the internal region of interest.

14. The method of claim 13, further comprising performing nuclear magnetic resonance spectroscopy.

15. The method of claim 13, further comprising performing chemical shift analysis.

16. The method of claim 13, further comprising withdrawing fluid from a formation via the probing module.

17. The method of claim 13, further comprising generating a pulse field gradient.

18. The method of claim 13, further comprising:

moving the probing module, thereby changing the region of interest; and collecting the received external nuclear magnetic resonance signal over the changing region of interest.

* * * * *